(12) United States Patent
Cheng et al.

(10) Patent No.: US 10,886,384 B2
(45) Date of Patent: Jan. 5, 2021

(54) FABRICATION OF A VERTICAL FIN FIELD EFFECT TRANSISTOR (VERTICAL FINFET) WITH A SELF-ALIGNED GATE AND FIN EDGES

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 20 days.

(21) Appl. No.: 16/104,382

(22) Filed: Aug. 17, 2018

(65) Prior Publication Data

US 2018/0374933 A1    Dec. 27, 2018

Related U.S. Application Data

(63) Continuation of application No. 15/177,362, filed on Jun. 9, 2016, now Pat. No. 10,103,246.

(51) Int. Cl.
*H01L 21/8234* (2006.01)
*H01L 29/66* (2006.01)
(Continued)

(52) U.S. Cl.
CPC .. *H01L 29/66666* (2013.01); *H01L 21/02129* (2013.01); *H01L 21/02271* (2013.01);
(Continued)

(58) Field of Classification Search
CPC ............. H01L 21/8234; H01L 29/0649; H01L 21/823481; H01L 21/823878; H01L 21/023487
See application file for complete search history.

(56) References Cited

U.S. PATENT DOCUMENTS 6,821,834 B2    11/2004  Ando
6,852,576 B2    2/2005   Lin et al.
(Continued)

OTHER PUBLICATIONS

List of IBM Patents or Patent Applications Treated as Related dated Aug. 17, 2018, 2 pages.

*Primary Examiner* — Marcos D. Pizarro
*Assistant Examiner* — Quinton A Brasefield
(74) *Attorney, Agent, or Firm* — Tutunjian & Bitetto, P.C.; Daniel P. Morris

(57) ABSTRACT

A method of forming a vertical fin field effect transistor with a self-aligned gate structure, comprising forming a plurality of vertical fins on a substrate, forming gate dielectric layers on opposite sidewalls of each vertical fin, forming a gate fill layer between the vertical fins, forming a fin-cut mask layer on the gate fill layer, forming one or more fin-cut mask trench(es) in the fin-cut mask layer, and removing portions of the gate fill layer and vertical fins not covered by the fin-cut mask layer to form one or more fin trench(es), and two or more vertical fin segments from each of the plurality of vertical fins, having a separation distance, $D_1$, between two vertical fin segments.

20 Claims, 12 Drawing Sheets

(51) Int. Cl.

| | | |
|---|---|---|
| *H01L 21/02* | (2006.01) | |
| *H01L 21/308* | (2006.01) | |
| *H01L 29/423* | (2006.01) | |
| *H01L 29/40* | (2006.01) | |
| *H01L 21/3065* | (2006.01) | |
| *H01L 29/78* | (2006.01) | |
| *H01L 29/786* | (2006.01) | |
| *H01L 21/225* | (2006.01) | |

(52) U.S. Cl.
CPC ...... *H01L 21/3065* (2013.01); *H01L 21/3081* (2013.01); *H01L 21/3086* (2013.01); *H01L 29/401* (2013.01); *H01L 29/4238* (2013.01); *H01L 29/42356* (2013.01); *H01L 29/66742* (2013.01); *H01L 29/66795* (2013.01); *H01L 29/7827* (2013.01); *H01L 29/78642* (2013.01); *H01L 21/2254* (2013.01)

(56) References Cited

U.S. PATENT DOCUMENTS

| | | |
|---|---|---|
| 7,064,022 B1 | 6/2006 | Hill et al. |
| 7,071,064 B2 | 7/2006 | Doyle et al. |
| 7,528,439 B2 | 5/2009 | Tang et al. |
| 7,683,428 B2 | 3/2010 | Chidambarro et al. |
| 8,617,996 B1 * | 12/2013 | Chi .................. H01L 21/308 438/700 |
| 8,637,849 B2 | 1/2014 | Deligianni et al. |
| 8,658,536 B1 * | 2/2014 | Choi .................. H01L 21/308 257/E21.409 |
| 8,703,557 B1 * | 4/2014 | Cai .................. H01L 29/6681 257/347 |
| 8,722,491 B2 | 5/2014 | Park et al. |
| 9,153,447 B2 | 10/2015 | Jagannathan et al. |
| 9,362,404 B2 * | 6/2016 | Chen .................. H01L 29/7851 |
| 2007/0114612 A1 | 5/2007 | Ahn et al. |
| 2012/0238061 A1 | 9/2012 | Fischer et al. |
| 2013/0065326 A1 * | 3/2013 | Sudo .................. H01L 27/228 438/3 |
| 2013/0244387 A1 * | 9/2013 | Cho .................. H01L 21/76224 438/283 |
| 2015/0357439 A1 | 12/2015 | Liu et al. |
| 2016/0293756 A1 * | 10/2016 | Liu .................. H01L 29/7827 |
| 2017/0005169 A1 * | 1/2017 | Loubet .................. H01L 29/0623 |

* cited by examiner

FABRICATION OF A VERTICAL FIN FIELD EFFECT TRANSISTOR (VERTICAL FINFET) WITH A SELF-ALIGNED GATE AND FIN EDGES

BACKGROUND

Technical Field

The present invention generally relates to self-aligned gate and fin edge, and more particularly to an approach to reduce the dimension between neighboring fin ends to increase device density by cutting the gate and fin concurrently.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present principles, a method is provided for forming a vertical fin field effect transistor (vertical finFET) with a self-aligned gate structure. The method includes the step of forming a plurality of vertical fins on a substrate, forming gate dielectric layers on at least opposite sidewalls of each vertical fin, forming a gate fill layer between the vertical fins, forming a fin-cut mask layer at least on predetermined portions of the gate fill layer, forming one or more fin-cut mask trench(es) in the fin-cut mask layer, removing portions of the gate fill layer and vertical fins not covered by the fin-cut mask layer to form one or more fin trench(es), and to form two or more vertical fin segments from each of the plurality of vertical fins, wherein there is a separation distance, $D_1$, between each of the two vertical fin segments.

The method further includes the step of forming a fin liner in at least a portion of the one or more fin trench(es), and annealing the fin liner to form a doped layer on at least a portion of the vertical fin segments exposed in the fin trench(es).

The method further includes the step of removing the fin liner and a portion of a doped region beneath the vertical fins to extend each of the one or more fin trench(es) to the substrate and form two doped region segments from each of the doped regions.

In accordance with an embodiment of the present principles, a method is provided for forming a vertical fin field effect transistor (vertical finFET) with a self-aligned with a self-aligned gate structure and doped layer. The method includes the step of forming a plurality of vertical fins on a substrate, forming dielectric layers on at least opposite sidewalls of each vertical fin, forming a bottom spacer layer on exposed portions of the substrate surface, forming a gate fill layer on the bottom spacer layer between the vertical fins, forming a fin-cut mask layer at least on predetermined portions of the gate fill layer, forming one or more fin-cut mask trench(es) in the fin-cut mask layer, removing portions of the gate fill layer and vertical fins not covered by the fin-cut mask layer to form one or more fin trench(es), and to form two vertical fin segments from each of the plurality of vertical fins with a separation distance in the range of about 10 nm to about 200 nm between the two vertical fin segments, forming a fin liner on at least a portion of the sidewalls of the one or more fin trench(es), and annealing the fin liner to form a doped layer on at least a portion of the vertical fin segments exposed in the fin trench(es).

The method further includes the step of forming a dielectric fill in the one or more fin trench(es) between adjacent vertical fin segments.

In accordance with another embodiment of the present principles, a vertical fin field effect transistor device with a self-aligned gate structure is provided. The device includes two or more vertical fin segments formed in a column on the substrate, wherein there is a separation distance, $D_1$, between each of the two or more vertical fin segments in the column, one or more doped region segments formed in a substrate beneath at least one of the two or more vertical fin segments, and a gate dielectric layer on each of the opposing sidewalls of each vertical fin segment, wherein the vertical fin segments are separated by the separation distance, $D_1$.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
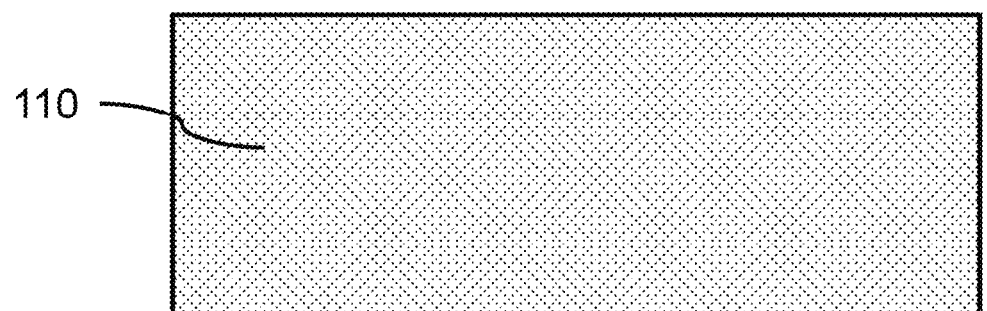
FIG. 1 shows a cross-sectional side view of a substrate, in accordance with an embodiment of the present principles.

Principles and embodiments of the present disclosure relate generally to controlling feature locations, dimensions, and inter-feature pitch by reducing or avoiding variations in feature placement through the self-alignment of a fin trench and doped layer. Self-alignment is a process in which control of the placement/formation of device components or features is not limited by the tolerance of control on the positioning of a lithography mask. A device component (e.g., a spacer) or feature (e.g., doped region) may be located through control of feature widths and/or layer thicknesses, or avoidance of sequential mask positionings that may introduce cumulative placement errors.

For each lithography step, a lithography mask is aligned with features already present on a substrate, and the location of future fabricated features may also be taken into account. The continued reduction in feature sizes has made this alignment more and more difficult. Two such features implemented in the construction of vertical fin field effect transistors (vertical finFETs) is the doped region in the substrate, that may form a bottom source/drain, and a shallow trench isolation region (STI) that may be formed in the substrate to electrically separate two neighboring devices. A problem that can arise is the ability to align a lithography mask with one or more fins already patterned and formed on the substrate. Misalignment of the lithography mask can result in the misplacement of a masked area or an opening in a mask layer after patterning and development. Features present on the substrate, therefore, may not be sufficiently covered by a protective masking layer, and/or an opening in the mask layer may be located in an unacceptable position resulting in the incorrect placement of a subsequent feature, for example, a trench for an STI. Subsequent etchings or depositions may create device features that are too close together, too far apart, not sufficiently overlapping, or interfering, for example, due to excessive overlap.

In one or more embodiments, an opening in a mask may be suitably aligned with the location of existing fins on a substrate to allow formation of a bottom source/drain below the fins through an ion implantation process. A doped bottom plate may be formed in a region of the substrate that overlaps the position of the existing fins on the substrate. Alignment of the mask may be controlled by relying on the thickness of a mask layer on the vertical surfaces of device features to define the location of an opening and subsequent etching and/or depositions.

In one or more embodiments, a hardmask may be formed on the surfaces perpendicular to the substrate surface by a conformal deposition that allows accurate control of the hardmask thickness on both the vertical surfaces and the substrate surface. Control of the hardmask thickness on the vertical surfaces can provide controlled displacement of an opening from the vertical surface by a lateral distance equal to the thickness. In various embodiments, the thickness of a conformally deposited hardmask layer may be sufficient to fill the space between two adjacent vertical fins, and thereby pinch off the region between the fins.

Exemplary applications/uses to which the present principles can be applied include, but are not limited to: formation of vertical finFETs, complementary metal oxide silicon (CMOS) field effect transistors (FETs) formed by coupled finFETs, and digital gate devices (e.g., NAND, NOR, XOR, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Referring now to the drawings in which like numerals represent the same or similar elements and initially to FIG. 1, shows a cross-sectional side view of a substrate, in accordance with an exemplary embodiment.

It should be noted that certain features may not be shown in all figures for the sake of clarity. This is not intended to be interpreted as a limitation of any particular embodiment, or illustration, or scope of the claims.

In one or more embodiments, a substrate 110 may be a semiconductor or an insulator with an active surface semiconductor layer. The substrate may be crystalline, semicrystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
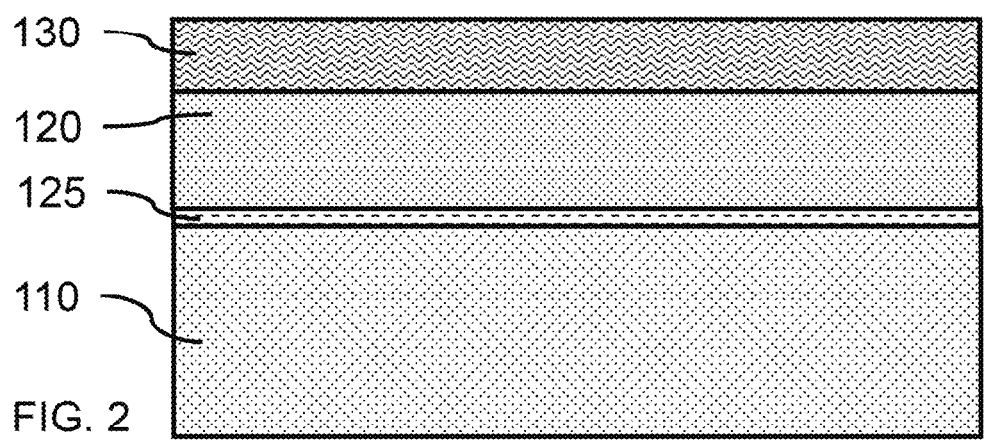
FIG. 2 is a cross-sectional side view of a substrate with a hardmask layer, a liner layer, and a photo mask layer, in accordance with an exemplary embodiment.

FIG. 2 is a cross-sectional side view of a substrate with a hardmask layer, a liner layer, and a photo mask layer, in accordance with an exemplary embodiment.

In one or more embodiments, a hardmask layer 120 may be formed on an exposed surface of the substrate 110. A photo mask layer 130 may be formed on the exposed surface of the hardmask layer 120. In various embodiments, the hardmask layer may be an oxide, for example, silicon oxide (SiO), a nitride, for example, a silicon nitride (SiN), or an oxynitride, for example, silicon oxynitride (SiON), or combinations thereof. In various embodiments, the hardmask layer 120 may be silicon nitride (SiN), for example, $Si_3N_4$. The hard mask layer may also be formed by a thermal process, such as, for example, oxidation or nitridation of the top semiconductor layer. A combination of the various processes may also be used to form hardmask layer 120.

In one or more embodiments, the hardmask layer 120 may have a thickness in the range of about 20 nm to about 100 nm, or in the range of about 35 nm to about 75 nm, or in the range of about 45 nm to about 55 nm.

In various embodiments, hardmask layer 130 may be a nitride, for example, silicon nitride (SiN), silicon oxynitride (SiON), or a combination thereof.

In one or more embodiments, a liner layer 125 may be formed on at least a portion of the substrate 110. A hardmask layer 130 may be formed on at least a portion of the liner layer 125. The liner layer 125 may have a thickness in the range of about 1 nm to about 10 nm, or in the range of about 2 nm to about 5 nm.

In various embodiments, liner layer 125 may be an oxide, for example, silicon oxide (SiO), silicon oxynitride (SiON), or a combination thereof. The liner layer 125 may protect the underlying substrate material from having defects introduced by a silicon nitride deposition. The liner layer 125 may be a material different than the hardmask layer 130, where the liner layer 125 may act as an etch stop layer.

In one or more embodiments, the liner layer 125 and hardmask layer 120 may form one or more fin templates. In various embodiments, the hardmask layer 120 may be formed directly on the substrate 110 without an intervening liner layer 125.

In one or more embodiments, a photo mask layer 130 may be formed on the hardmask layer 120. The photo mask layer 130 may be a temporary resist (e.g., poly methyl methacrylate (PMMA)) that may be deposited on the hardmask layer 120, patterned, and developed to expose portions of the hardmask layer 120. The photo mask layer 130 may be a positive resist or a negative resist.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Figure 3:
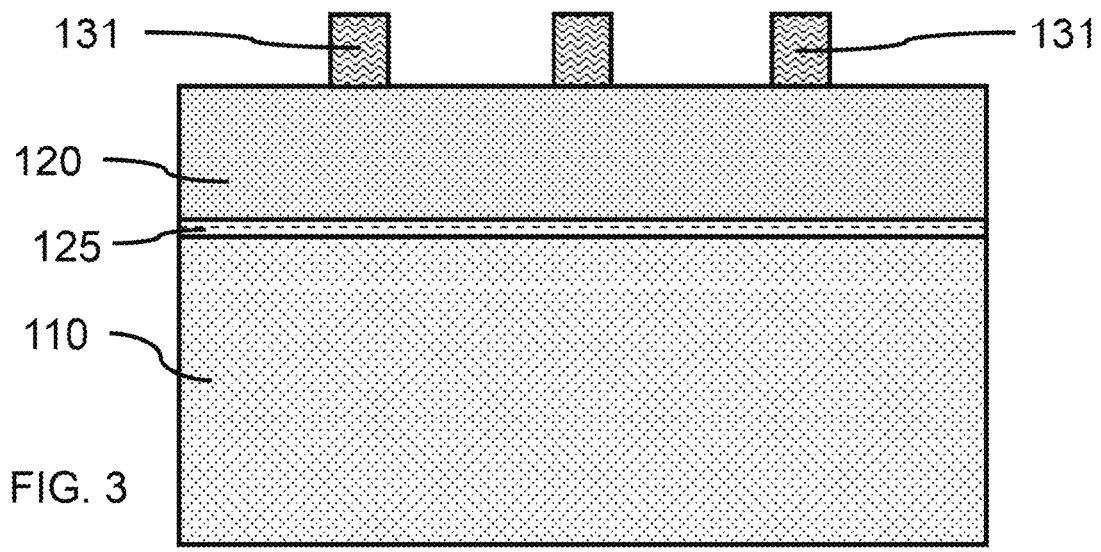
FIG. 3 is a cross-sectional side view of a photo mask layer patterned on the hardmask layer, in accordance with an exemplary embodiment.

FIG. 3 is a cross-sectional side view of a photo mask layer patterned on the hardmask layer, in accordance with an exemplary embodiment.

In one or more embodiments, the photo mask layer 130 may be patterned and developed to form photo mask blocks 131 covering at least a portion of the surface of the hardmask layer 120. Portions of the photo mask layer 130 may be removed to form the photo mask blocks 131 and expose underlying portions of the hardmask layer 120. The photo mask blocks may protect the covered portion of the hardmask layer 120, while exposed portions of the hardmask layer 120 may be etched to form hardmask fin templates on the substrate 110. In one or more embodiments, a photomask layer 130 may be a soft mask, for example, PMMA. One or more photo mask blocks may define the width, length, and pitch of the one or more hardmask fin templates and thereby, the width, length, and pitch of the one or more vertical fins.

Figure 4:
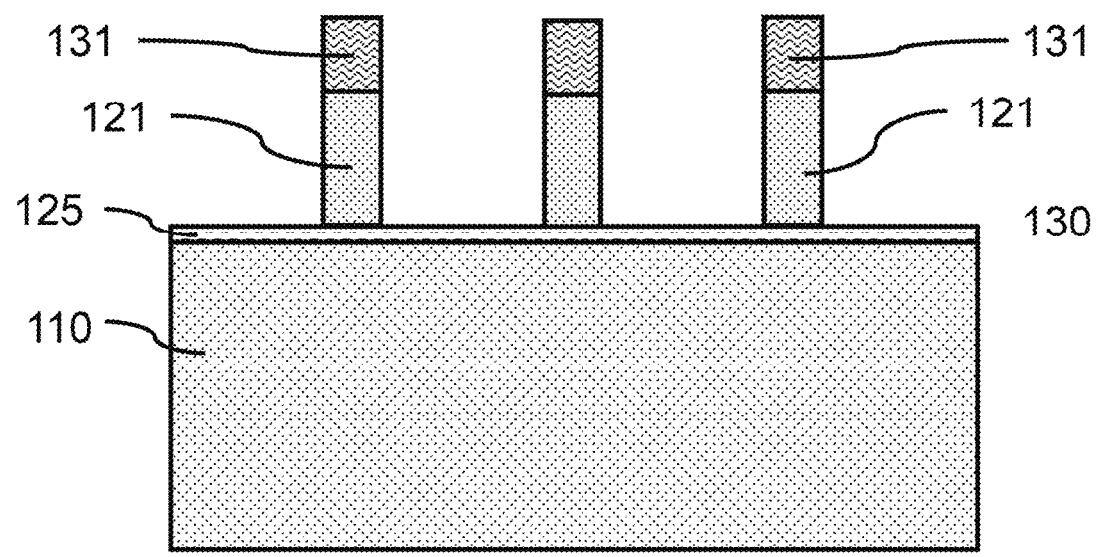
FIG. 4 is a cross-sectional side view of a plurality of photo mask blocks on the hardmask fin templates on the substrate, in accordance with an exemplary embodiment.

FIG. 4 is a cross-sectional side view of a plurality of photo mask blocks on the hardmask fin templates on the substrate, in accordance with an exemplary embodiment.

In one or more embodiments, the hardmask layer 120 may be etched to form one or more hardmask fin template(s) 121, where the photo mask blocks 131 defined the width, length, and location of the hardmask fin template(s) 121 on the substrate 110. In various embodiments, the liner layer 125 may act as an etch stop.

Figure 5:
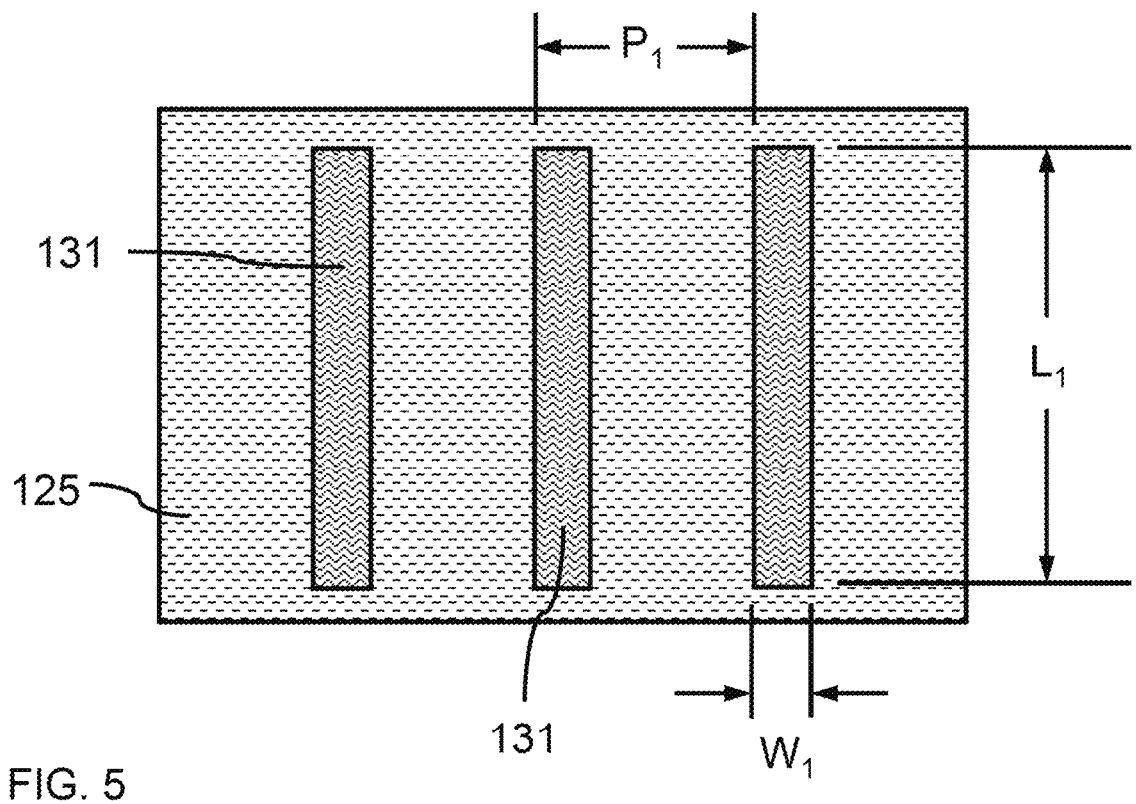
FIG. 5 is a top view of a plurality of photo mask blocks on the hardmask fin templates and substrate, in accordance with an exemplary embodiment.

FIG. 5 is a top view of a plurality of photo mask blocks on the hardmask fin templates and substrate, in accordance with an exemplary embodiment.

In one or more embodiments, the photo mask block(s) 131 and/or hardmask fin template(s) 121 may have a width, $W_1$, in the range of about 6 nm to about 20 nm, or may have a width in the range of about 8 nm to about 15 nm, or may have a width in the range of about 10 nm to about 12 nm. The photo mask blocks 131 may have a length, $L_1$, in the range of about 100 nm to about 1000 nm, or in the range of about 100 nm to about 500 nm, or in the range of about 100 nm to about 400 nm, or in the range of about 100 nm to about 200 nm.

In various embodiments, there may be a pitch, $P_1$, between adjacent photo mask blocks 131 and/or hardmask fin template(s) 121 in the range of about 30 nm to about 200 nm, or in the range of about 30 nm to about 100 nm, or in the range of about 30 nm to about 50 nm, or about 42 nm.

Figure 6:
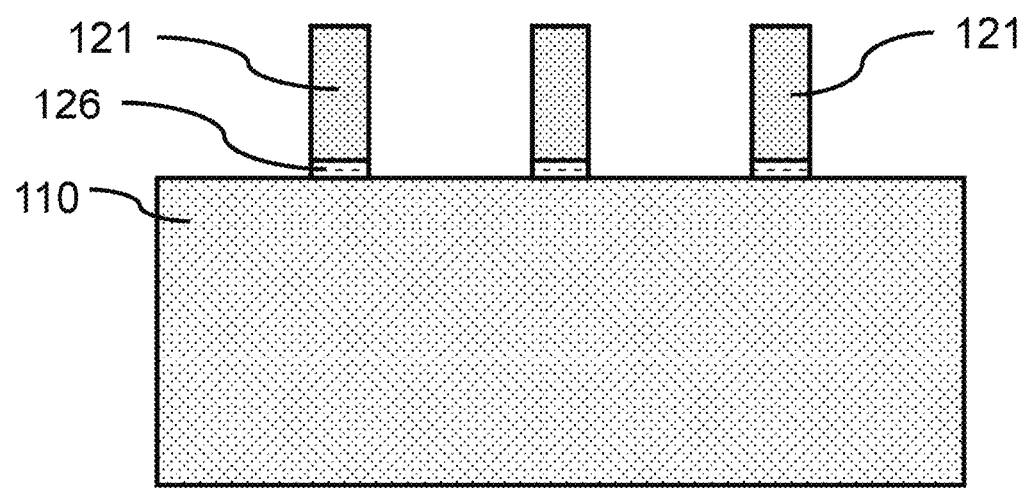
FIG. 6 is a cross-sectional side view of a hardmask fin template on the substrate, in accordance with an exemplary embodiment.

FIG. 6 is a cross-sectional side view of hardmask fin templates and template liners on the substrate, in accordance with an exemplary embodiment.

In one or more embodiments, portions of the liner layer 125 may be removed to form separate template liners 126. The hardmask fin templates 121 and template liners 126 may be used to form a plurality of fins from the underlying substrate 110.

In one or more embodiments, the photo mask blocks 131 may be removed to expose the top surface(s) of the one or more hardmask fin template(s) 121. The photo mask blocks 131 may be removed by known stripping methods.

Figure 7:
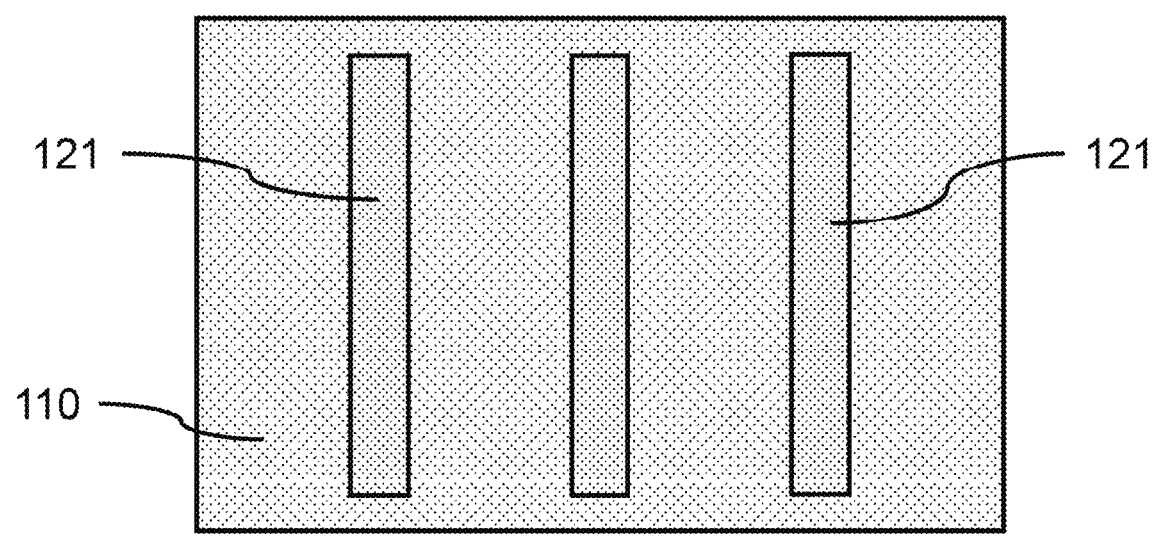
FIG. 7 is a top view of a plurality of hardmask fin templates on a substrate, in accordance with an exemplary embodiment.

FIG. 7 is a top view of a plurality of hardmask fin templates on a substrate, in accordance with an exemplary embodiment.

In one or more embodiments, portions of the substrate 110 between the hardmask fin template(s) 121 may be removed to form one or more vertical fin(s) 111. The portions of the substrate 110 may be removed by an anisotropic dry etch, for example, a dry plasma etch. The dry plasma etch may be a reactive ion etch (RIE) to provide a directional etch with control of sidewall etching.

Figure 8:
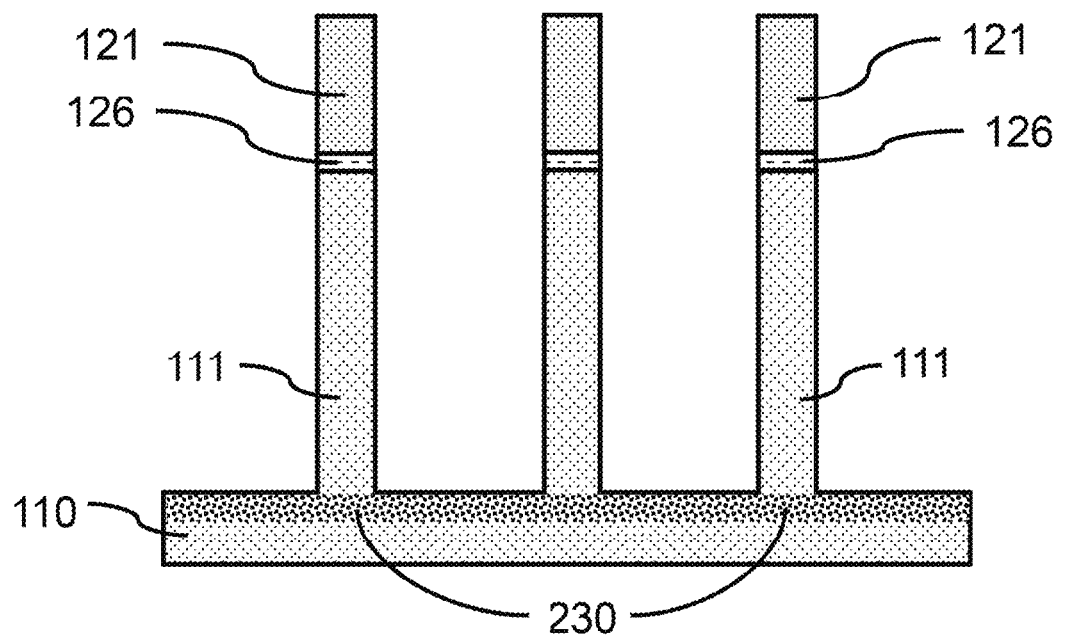
FIG. 8 is a cross-sectional side view of a hardmask fin template on each of a plurality of vertical fins on the substrate, in accordance with an exemplary embodiment.

FIG. 8 is a cross-sectional side view of a hardmask fin template and template liner on each of a plurality of vertical fins on the substrate, in accordance with an exemplary embodiment.

In various embodiments, the vertical fin(s) 111 may be formed from the substrate material. The substrate may be a single crystal Si substrate and the vertical fins may be single crystal silicon. In various embodiments, the vertical fin(s) 111 may be suitably doped to form channels of a vertical finFET.

In various embodiments, a sidewall image transfer (SIT) technique may be used to form one or more vertical fins 111 on the substrate. In a typical SIT process, upright spacers are formed on the sidewall of a sacrificial mandrel. The sacrificial mandrel is removed and the remaining upright spacers are used as hardmask fin template(s) 121 to mask the top semiconductor layer, and form one or more vertical fins 111 by etching the substrate 110. The upright spacers are then removed after the semiconductor vertical fins 111 have been formed.

In various embodiments, the vertical fin(s) 111 may have a width in the range of about 6 nm to about 20 nm, or may have a width in the range of about 8 nm to about 15 nm, or in the range of about 10 nm to about 12 nm.

In one or more embodiments, a doped region 230 may be formed in the substrate 110. The doped region may be formed in-situ or ex-situ below the vertical fin(s) 111. One or more doped regions 230 may be formed in the substrate above which each of the one or more vertical fins may be formed. The dopant may be provided to the doped region(s) 230 by ion implantation, and source/drains formed by annealing the doped region(s). In various embodiments, the doped region 230 (i.e., source/drain region) may be n-doped or p-doped. The doped region 230 may form a bottom source/drain of a vertical fin field effect transistor (vertical finFET). In various embodiments, a plurality of vertical fins 111 may be electrically coupled to the same bottom source/drain to form a multi-fin vertical FET. The vertical fin(s) and bottom source/drain(s) may be suitably doped to form an NFET or a PFET.

Figure 9:
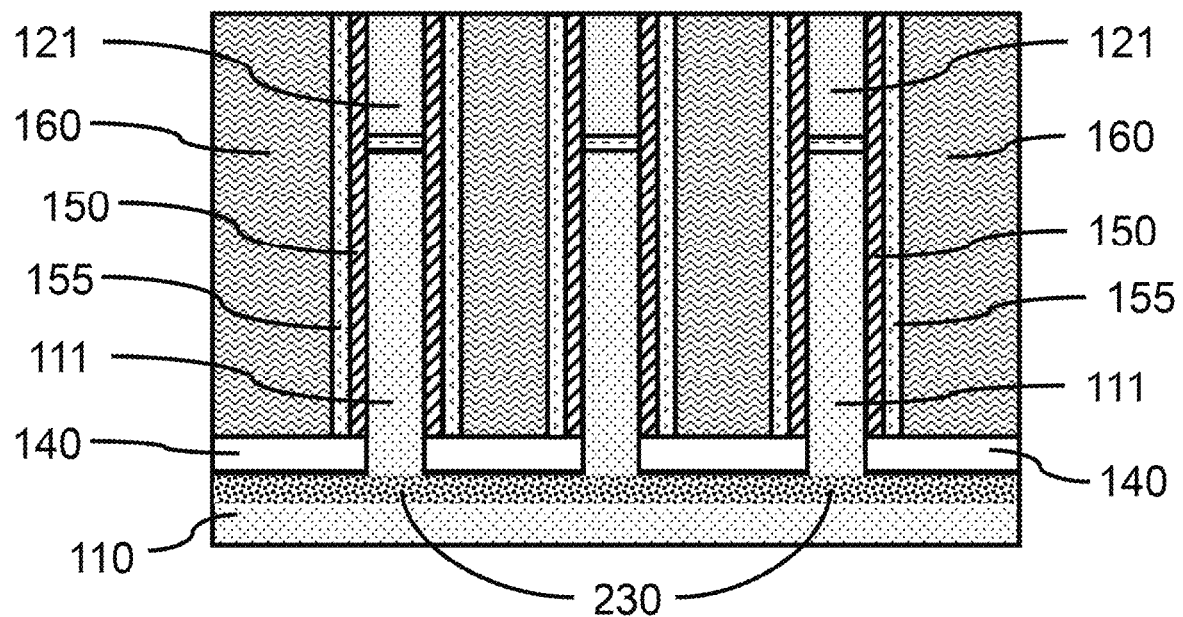
FIG. 9 is a cross-sectional side view of a bottom spacer layer on a doped portion of the substrate, and a gate structure on the hardmask fin templates and vertical fins, in accordance with an exemplary embodiment.

FIG. 9 is a cross-sectional side view of a bottom spacer layer on a doped portion of the substrate, and a gate structure on the hardmask fin templates and vertical fins, in accordance with an exemplary embodiment.

In one or more embodiments, a bottom spacer layer 140 may be formed on one or more hardmask fin template(s) 121, template liners 126, vertical fins 111, and at least a portion of the substrate 110. The bottom spacer layer 140 may be formed by a blanket deposition over the hardmask fin template(s) 121 and vertical fin(s) 111, where the blanket deposition may be a conformal deposition, for example, by ALD, CVD, or a combination thereof, or the deposition may be a directional deposition in which the spacer layer 140 may be formed preferentially on the exposed surfaces of the substrate 110, for example, by PVD and/or gas cluster ion beam (GCIB) deposition. Deposited portions of the bottom spacer layer 140 may be removed from the sidewalls of the hardmask fin template(s) 121 and at least a portion of vertical fin(s) 111 to leave a bottom spacer layer 140 on the exposed portions of the substrate surface adjacent to the lower portion(s) of the vertical fin(s) 111.

In one or more embodiments, the bottom spacer layer 140 may be an oxide, for example, silicon oxide (SiO).

In one or more embodiments, the bottom spacer layer 140 may have a thickness in the range of about 3 nm to about 25 nm, or in the range of about 5 nm to about 20 nm. The thickness of the bottom spacer layer 140 may provide electrical isolation of a subsequently formed work function layer(s) and/or a conducting gate fill layer from a doped source/drain region 230 in the substrate 110.

In one or more embodiments, a gate dielectric layer 150 may be formed on at least a portion of the vertical fin(s) 111. A gate dielectric layer 150 may be formed on at least a portion of the hardmask fin template(s) 121. The gate dielectric layer 150 formed on at least opposite sidewalls of the same vertical fin 111 may form part of a gate structure of a vertical finFET, where the gate dielectric layer 150 may wrap around the sidewalls and endwalls to encase the fin 111 in gate dielectric layer 150.

In one or more embodiments, a gate structure may be formed on the vertical fins 111 by depositing a gate dielectric layer 150 on at least a portion of the exposed sidewall of the vertical fin(s) 111, where the gate dielectric layer 150 may also be formed on at least a portion of the bottom spacer layer 140 and/or hardmask fin template(s) 121. The gate dielectric layer 150 may be conformally deposited, for example, by CVD, ALD, or a combination thereof. Undesired portions of the gate dielectric layer 150 may be removed from at least a portion of the bottom spacer layer 140 to form at least a portion of the gate structure on the vertical fin(s) 111. Portions of gate dielectric layer 150 formed on the bottom spacer layer 140 and/or substrate 110 may be removed by a directional etch, for example, RIE.

In various embodiments, the gate dielectric layer 150 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-K compounds may vary.

In one or more embodiments, a work function layer 155 may be deposited over the gate dielectric layer 150. The work function layer 155 may form part of a gate structure, where the gate structure may be on a vertical fin segment 116. In various embodiments, a work function layer 155 may be formed on the gate dielectric layer 150 between the gate dielectric layer 150 and the gate fill layer 160.

In various embodiments, the work function layer 155 may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof.

In various embodiments, the work function layer 155 may have a thickness in the range of about 3 nm to about 11 nm, or may have a thickness in the range of about 5 nm to about 8 nm.

In one or more embodiments, a gate fill layer 160 may be formed on the bottom spacer layer 140 and gate dielectric layer 150, where the gate fill layer 160 may be a conductive material that forms part of a gate structure on a vertical fin 111. In various embodiments, the gate fill layer 160 may be formed on the bottom spacer layer 140 and work function layer 155. The gate fill layer 160 may be formed by a blanket deposition that fills the spaces between the vertical fins 111, for example, by ALD, CVD, PVD, or a combination thereof. The gate fill layer 160 may extend above the tops surfaces of the hardmask fin template(s) 121. The portion of gate fill layer 160 above the tops surfaces of the hardmask fin template(s) 121 may be removed by chemically-mechanically polishing (CMP).

In various embodiments, the conductive gate fill layer 160 may be a metal, where the metal may be tungsten (W), titanium (Ti), molybdenum (Mo), cobalt (Co), or combinations thereof.

Figure 10:
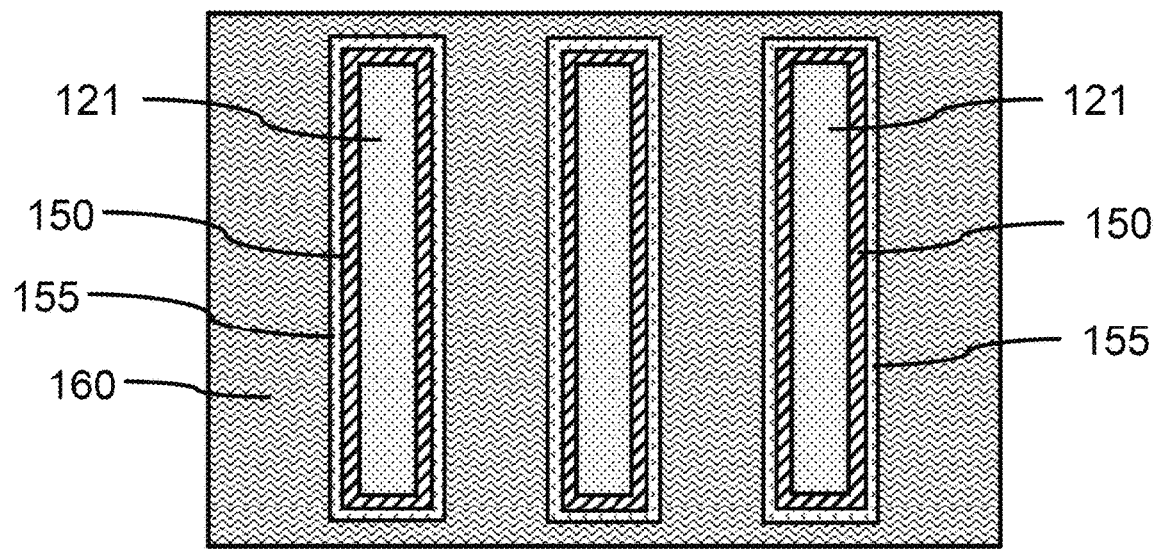
FIG. 10 is a top view of a gate fill layer surrounding a plurality of vertical fins and hardmask fin templates with gate dielectric layers and work function layers, in accordance with an exemplary embodiment.

FIG. 10 is a top view of a gate fill layer surrounding a plurality of vertical fins and hardmask fin templates with gate dielectric layers and work function layers, in accordance with an exemplary embodiment.

In various embodiments, the gate dielectric layer 150, work function layer 155, and/or the gate fill layer 160, may be chemically-mechanically polished to reduce the height of the gate dielectric layer 150, work function layer 155, and the gate fill layer 160 to the top surface of the hardmask fin template(s) 121. The CMP may be continued to reduce the height of the gate dielectric layer 150, the gate fill layer 160, the work function layer 155, and the hardmask fin template(s) 121, to provide a uniform flat surface.

The portions of the gate fill layer 160, work function layer 155, and/or gate dielectric layer 150 on top of the hardmask fin template(s) 121 may be removed by RIE or a suitable wet etch process. In various embodiments, the gate structure may wrap around three sides or four sides of the vertical fin(s) 111. The gate fill layer 160 may form a gate electrode for a vertical finFET.

Figure 11:
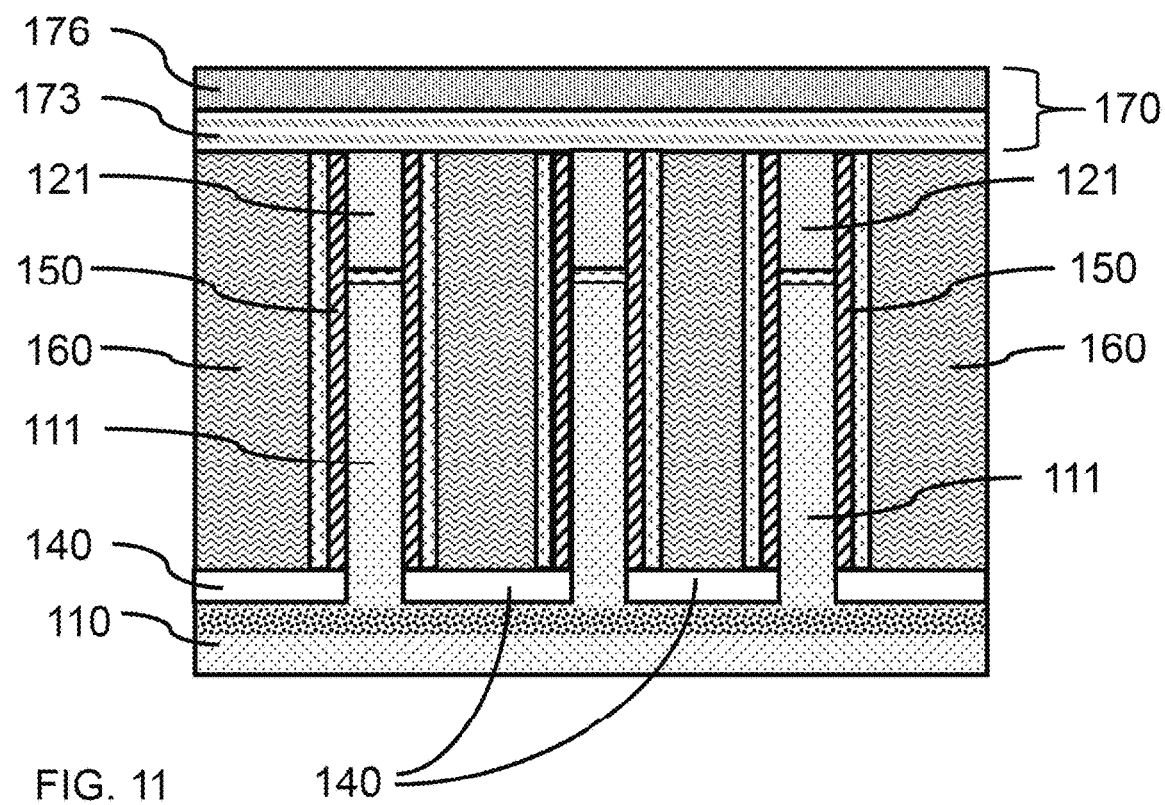
FIG. 11 is a cross-sectional side view of a fin-cut mask on the hardmask fin templates and gate fill layer, in accordance with an exemplary embodiment.

FIG. 11 is a cross-sectional side view of a fin-cut mask on the hardmask fin templates and gate fill layer, in accordance with an exemplary embodiment.

In one or more embodiments, a fin-cut mask layer 170 may be formed on the exposed top surface(s) of the hardmask fin template(s) 121, gate fill layer 160, work function layer 155, and/or gate dielectric layer 150. The fin-cut mask layer 170 may be formed by a deposition at least on predetermined portions of the hardmask fin template(s) 121, gate fill layer 160, gate dielectric layer 150, and/or work function layer 155.

In various embodiments, the fin-cut mask layer 170 may include two layers, where a fin-cut hardmask layer 173 may be formed on the exposed top surface(s) of the hardmask fin template(s) 121, gate fill layer 160, work function layer 155, and/or gate dielectric layer 150, and a fin-cut softmask layer 176 may be formed on the fin-cut hardmask layer 173. The fin-cut softmask 176 may be patterned and developed to expose portions of the underlying fin-cut hardmask 173.

In one or more embodiments, the fin-cut hardmask 173 may be a nitride, for example, silicon nitride (SiN), a silicon oxynitride (SiON), a silicon oxide (SiO), or a combination thereof. In various embodiments, the fin-cut softmask 176 may be a resist, for example, poly methyl methacrylate (PMMA), or polydimethylsiloxane (PDMS), as would be known in the art.

Figure 12:
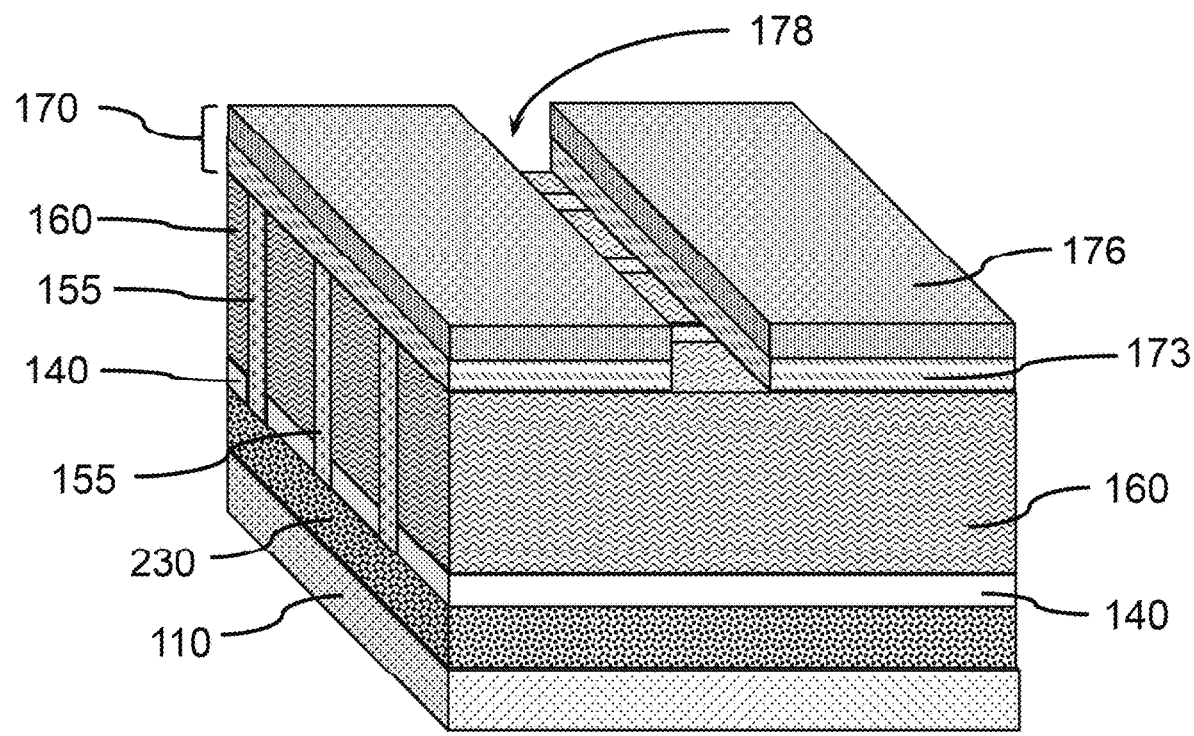
FIG. 12 is a perspective view of a cross-section of a fin-cut trench through a fin-cut mask, in accordance with an exemplary embodiment.

FIG. 12 is a perspective view of a cross-section of a fin-cut mask trench through a fin-cut mask, in accordance with an exemplary embodiment.

In one or more embodiments, the exposed portion(s) of the fin-cut hardmask 173 may be removed to form a fin-cut mask trench 178 exposing at least portions of the hardmask fin templates 121, gate fill layer 160, as well as gate dielectric layer 150 and work function layer 155, between the gate fill layer and hardmask fin templates. In various embodiments, the exposed portions of the fin-cut hardmask 173 may be removed by a dry etch, for example, a reactive ion etch (RIE). The fin-cut mask trench 178 may be approximately perpendicular (e.g., ±5°, ±3°) to the long axis of the one or more vertical fins 111 and hardmask fin templates 121.

In various embodiments, the width of the fin-cut mask trench 178 may define the separation distance between two vertical fin segments formed from the same vertical fin 111. The work function layer 155, gate dielectric layer 150, and gate fill layer 160, may be partitioned into two gate structures, where a gate structure is on each vertical fin segment 116.

Figure 13:
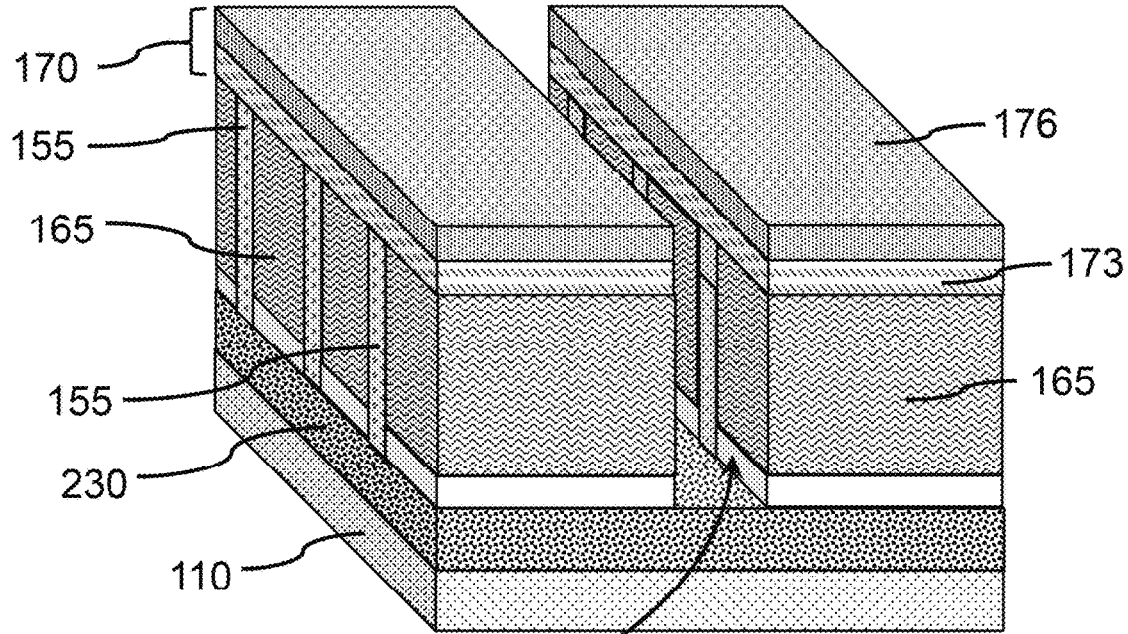
FIG. 13 is a perspective view of a cross-section of a fin trench through a fin-cut mask, vertical fins, hardmask fin templates, and gate fill layer, in accordance with an exemplary embodiment.

FIG. 13 is a perspective view of a cross-section of a fin trench through a fin-cut mask, vertical fins, hardmask fin templates, and gate fill layer, in accordance with an exemplary embodiment.

In one or more embodiments, a fin trench 180 may be formed in the gate fill layer 160, work function layer 155, gate dielectric layer 150, bottom spacer layer 140, vertical fin(s) 111, hardmask fin templates 121, and template liners 126, where the fin trench 180 may be aligned with the fin-cut mask trench 178. The fin trench 180 may be formed by RIE, where the material exposed by the fin-cut mask trench 178 is removed by an anisotropic etch. Portions of the gate fill layer 160, gate dielectric layer 150, work function layer 155, bottom spacer layer 140, vertical fin(s) 111, hardmask fin templates 121 and template liners 126, not covered by the fin-cut mask layer may be removed, for example, by etching, down to or below the surface of the substrate 110 to form the fin trench 180. The gate fill layer 160, gate dielectric layer 150, work function layer 155, and the vertical fins 111 may be cut by the same material removal process or series of material removal processes without repositioning the fin-cut mask trench 178, so a mask alignment or realignment step is not required to form the fin trench 180, gate fill blocks 165, gate structure, and vertical fin segments 116, in separate steps. The fin trench 180 may separate the vertical fins 111 into columns of two or more fin segments 116, and the gate fill layer 160 into a plurality of gate fill blocks 165, which may be adjacent to two fin segments 116. In various embodiments, the fin trench 180 may extend into the doped region(s) 230 and substrate 110 to form a shallow or deep trench isolation region to electrically separate devices formed by fin segments 116 in the same column.

In various embodiments, the fin trench 180 forms a separation distance, $D_1$, between two vertical fin segments 116 in the same column. The separation distance, $D_1$, may be between each of the two vertical fin segments formed from each of a plurality of vertical fins 111. The fin trench 180 also provides a separation distance, $D_1$, between two neighboring gate fill blocks 165.

In one or more embodiments, the separation distance, $D_1$, may be in the range of about 10 nm to about 200 nm, or in the range of about 30 nm to about 100 nm, or in the range of about 50 nm to about 80 nm. The separation distance, $D_1$, may be less than the separation distance formed by a classic fin-cut gate approach due to a reduced thickness of the gate fill layer 160 utilized on the endfaces of the fin segments 116 to avoid overlay and lateral etch issues.

Since the gate fill layer 160, gate dielectric layer 150, work function layer 155, and the vertical fins 111 may be cut by the same material removal process or series of material removal processes without repositioning the fin-cut mask trench 178, the edges of the gate fill layer 160, gate dielectric layer 150, and work function layer 155 are aligned with the edge(s) of the fin segments 116, such that the gate structure and channel are aligned in the finFET.

Figure 14:
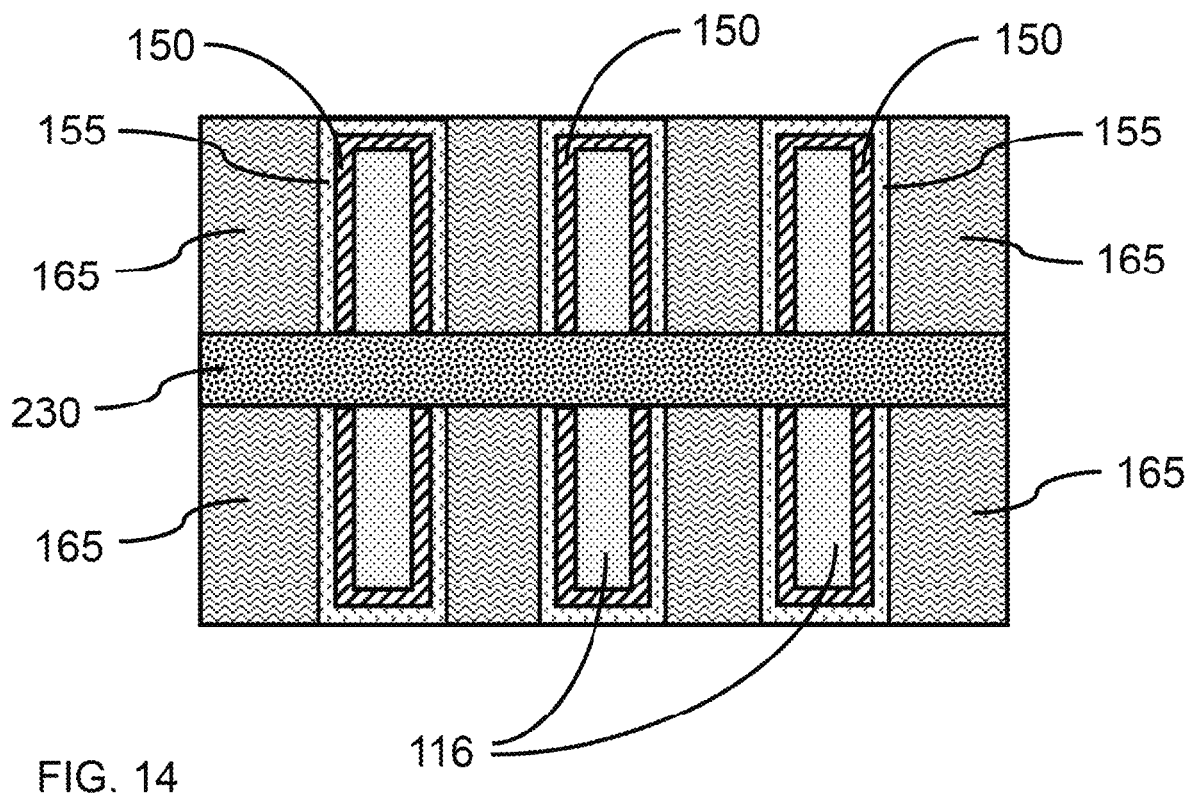
FIG. 14 is a top view of a fin trench separating vertical fin(s) and hardmask fin template(s) into segments, and the gate fill layer into gate fill blocks, on a substrate, in accordance with an exemplary embodiment.

FIG. 14 is a top view of a fin trench separating vertical fin(s) and hardmask fin template(s) into segments, and the gate fill layer into gate fill blocks, on a substrate, in accordance with an exemplary embodiment.

In one or more embodiments, one or more fin trench(es) 180 may be formed in the gate fill layer 160, hardmask fin templates 121, and vertical fins 111, where the exposed endwalls of the hardmask fin templates 121 and vertical fins 111 form at least a portion of the sidewalls of the fin trench(es) 180. The one or more fin trench(es) 180 may be formed across (e.g., at an angle or perpendicular to) the vertical fin(s) 111 and hardmask fin templates 121, and may expose portions of the doped regions 230 between the fin segments 116. In various embodiments, the fin trench(es) 180 may extend through the doped regions 230 into the bulk portion of the substrate 110 to electrically separate the doped regions 230 into separate bottom source/drains for separate vertical finFETs. The fin trench(es) 180 may extend through the gate fill layer 160 to form a plurality of gate fill blocks 165, and through the bottom spacer layer 140 to form separate bottom spacers 145. In various embodiments, the remaining hardmask fin templates 121, gate dielectric layers 150, gate fill blocks 165, and vertical fin segments 116 may form a plurality of devices having single or multiple fins.

Figure 15:
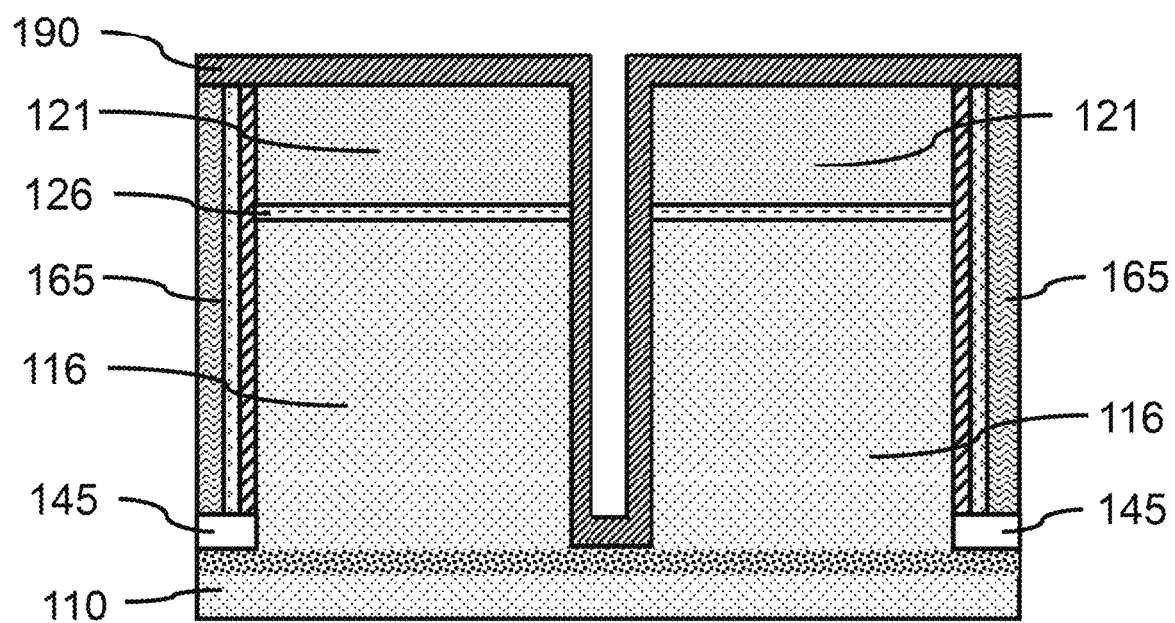
FIG. 15 is a cross-sectional side view of the long axis of the hardmask fin templates and vertical fin segments forming a column with a fin liner on the hardmask fin templates and vertical fin segments, in accordance with an exemplary embodiment.

FIG. 15 is a cross-sectional side view of the long axis of the hardmask fin templates and vertical fin segments forming a column with a fin liner on the hardmask fin templates and vertical fin segments, in accordance with an exemplary embodiment.

In one or more embodiments, a fin liner 190 may be formed in at least a portion of the one or more fin trench(es) 180 including the endwalls of the hardmask fin templates 121 and vertical fin segments 116, where the fin liner 190 may be in contact with at least a portion of the endwall(s) of the vertical fin segments 116. The fin liner 190 may be conformally deposited on the hardmask fin templates 121 and vertical fin segments 116 exposed by the fin trench 180, for example, by CVD, ALD, or a combination thereof, and may fill in part of the fin trench(es) 180.

In one or more embodiments, the fin liner 190 may be a silicon oxide, for example, phospho-silicate glass (PSG), boro-silicate glass (BSG), or boro-phospho-silicate glass (BPSG). The PSG, BSG, or BPSG may be conformally formed by low pressure CVD (LPCVD).

In various embodiments, the fin liner 190 may have a thickness in the range of about 2 nm to about 20 nm, or in the range of about 3 nm to about 10 nm, or in the range of about 4 nm to about 6 nm. In various embodiments, the fin liner 190 does not pinch off the fin trench(es) 180.

Figure 16:
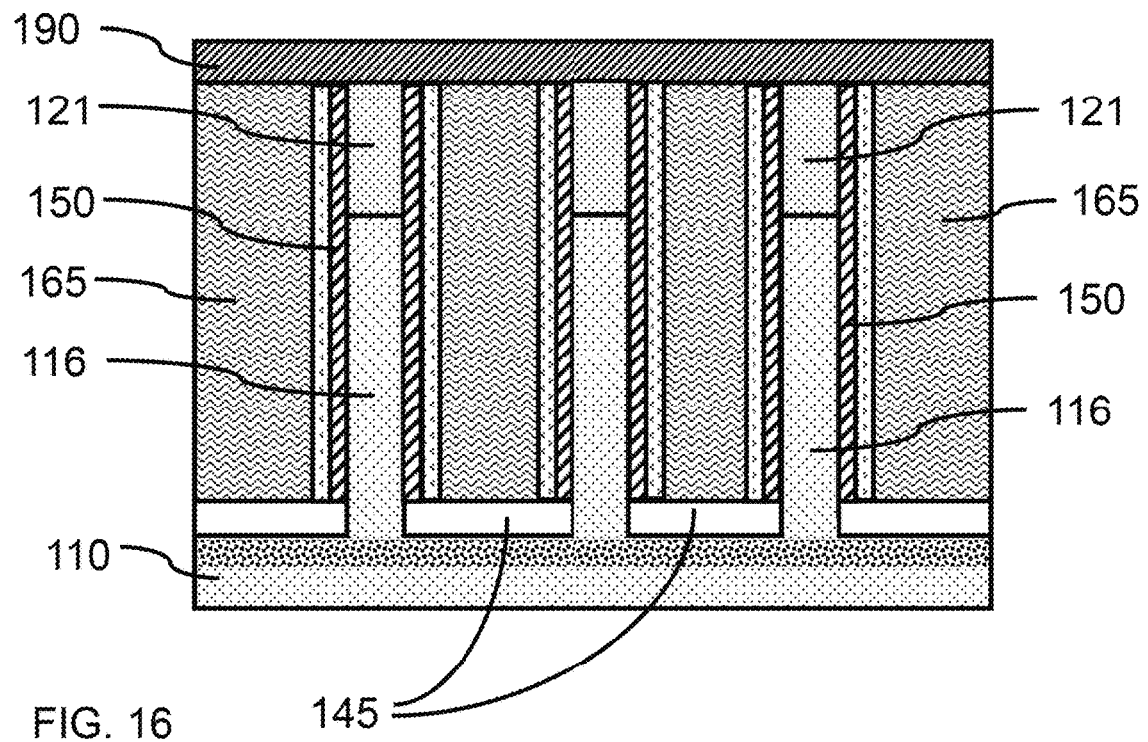
FIG. 16 is a cross-sectional side view of a fin liner on the hardmask fin templates and gate fill blocks, in accordance with an exemplary embodiment.

FIG. 16 is a cross-sectional side view of a fin liner on the hardmask fin templates and gate fill blocks, in accordance with an exemplary embodiment.

In various embodiments, the fin liner 190 may cover a plurality of adjacent hardmask fin templates 121, gate dielectric layers 150, work function layers 155, and gate fill blocks 165, and cover exposed portions of the vertical fin segment endwalls in the fin trench 180.

In various embodiments, the separate bottom spacers 145 are below the gate structure in the regions between the vertical fin segments 116, and electrically separate the gate structures from the underlying doped region 230.

Figure 17:
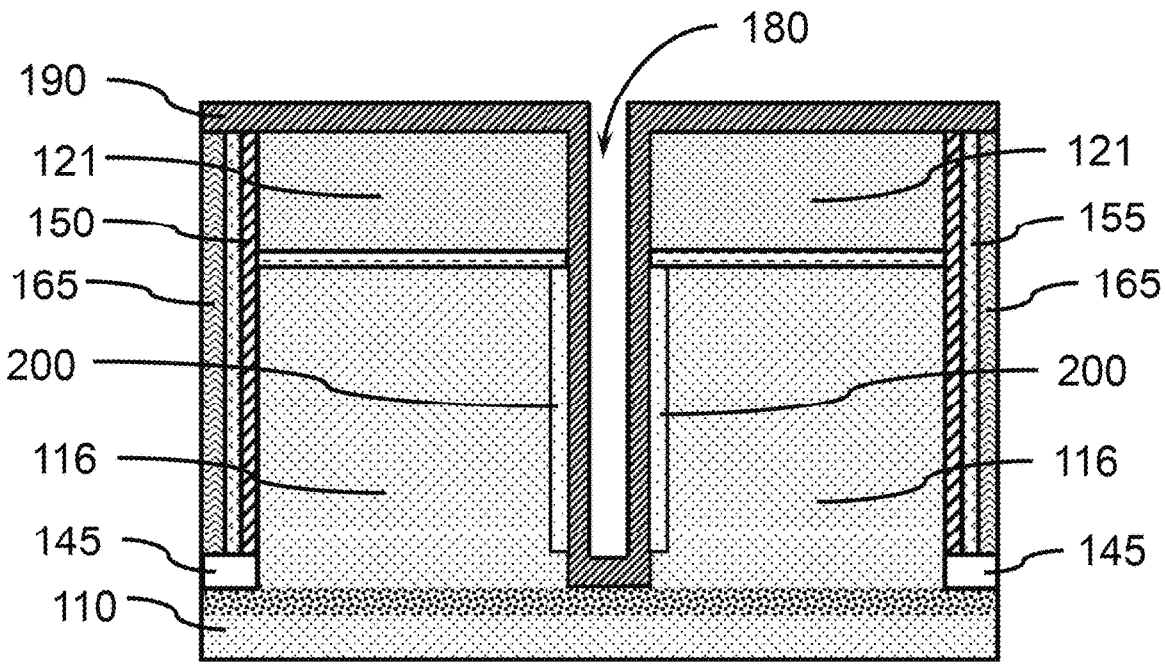
FIG. 17 is a cross-sectional side view of the long axis of the hardmask fin templates and vertical fin segments with a fin liner on the hardmask fin templates and gate fill blocks, in accordance with an exemplary embodiment.

FIG. 17 is a cross-sectional side view of the long axis of the hardmask fin templates and vertical fin segments with a fin liner on the hardmask fin templates and gate fill blocks, in accordance with an exemplary embodiment.

In one or more embodiments, the fin structure including the fin liner 190, vertical fin segments 116, and doped regions 230 are heat treated, where the heat treatment may be an anneal. The fin liner 190 may be annealed at a temperature sufficient to cause diffusion of a dopant element (e.g., boron, phosphorous) from the PSG, BSG, or BPSG to at least partially diffuse into the endwall(s) of the vertical fin segments 116. In various embodiments, the heat treatment may be an anneal at a temperature in the range of about 700° C. to about 1000° C., or about 900° C. to about 1300° C., where the anneal may be for a period of time in the range of 30 seconds to about 5000 seconds, or in the range of 60 seconds to about 1800 seconds, or in the range of 1 millisecond to 30 seconds.

In one or more embodiments, a doped layer 200 may be formed at the endwall surface of the vertical fin segments 116 by the heat treatment (e.g., rapid thermal anneal). The doped layer 200 may be formed on the endwalls of neighboring vertical fin segments 116 on opposite sides of the fin trench(es) 180, while the endwall opposite the doped layer 200 is in contact with a gate fill block 165. The material of the fin liner 190 may be selected to provide a doped layer 200 that has the opposite polarity as the dopant in the source/drains, for example, a finFET with p-doped source/drains would have a doped layer 200 that is n-doped (e.g., with phosphorous).

In various embodiments, the doped layer 200 may be formed by other doping processing, including but not limited to plasma doping, ion implantation, gas-phase doping, liquid phase doping, as well as combinations thereof.

In various embodiments, the doping concentration of the doped layer 200 may be in the range of about $1 \times 10^{16}$ to about $5 \times 10^{19}$, or about $1 \times 10^{16}$ to about $1 \times 10^{18}$, or about $1 \times 10^{17}$ to about $5 \times 10^{19}$. The doped layer 200 may extend into the vertical fin segment 116 to a depth of about 2 nm to about 20 nm, or to a depth of about 4 nm to about 10 nm.

In various embodiments, the doped layer 200 may counteract the electric potential interference between two nearby devices, although the gate does not extend around the cut endwall(s). Without intending to be bound by theory, it is believed that the doped layer 200 reduces leakage current along the ungated portion of the endwall adjacent to the fin trench 180.

Figure 18:
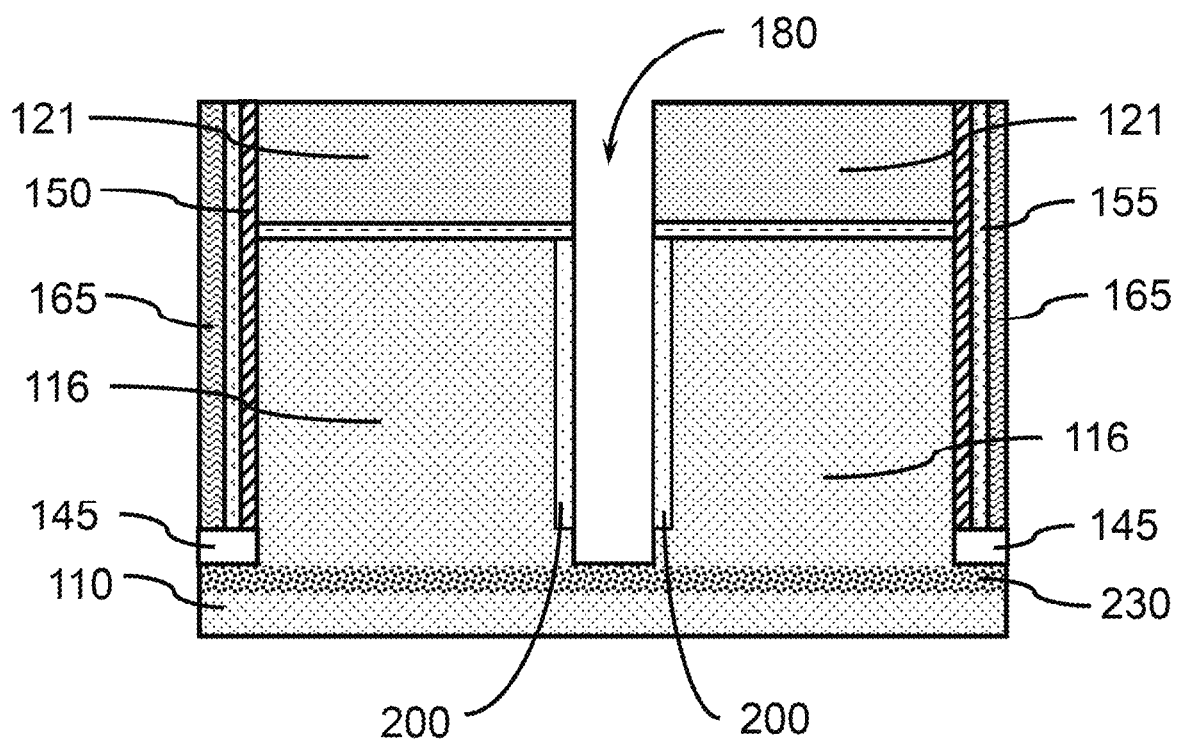
FIG. 18 is a cross-sectional side view of the long axis of the hardmask fin templates, and vertical fin segments with a doped layer after removal of the fin liner, in accordance with an exemplary embodiment.

FIG. 18 is a cross-sectional side view of the long axis of the hardmask fin templates, and vertical fin segments with a doped layer after removal of the fin liner, in accordance with an exemplary embodiment.

In one or more embodiments, the fin liner 190 may be removed from the surface of the vertical fin segments 116, template liners 126, and hardmask fin templates 121, where the fin liner 190 may be removed using a wet chemical etch (e.g., hydrofluoric acid solution). The fin liner 190 may be removed from the sides of the fin trench(es) 180, while the doped layer 200 remains with the endwall(s) of the vertical fin segments 116. The fin liner 190 may be removed selectively using a wet chemical etch.

Figure 19:
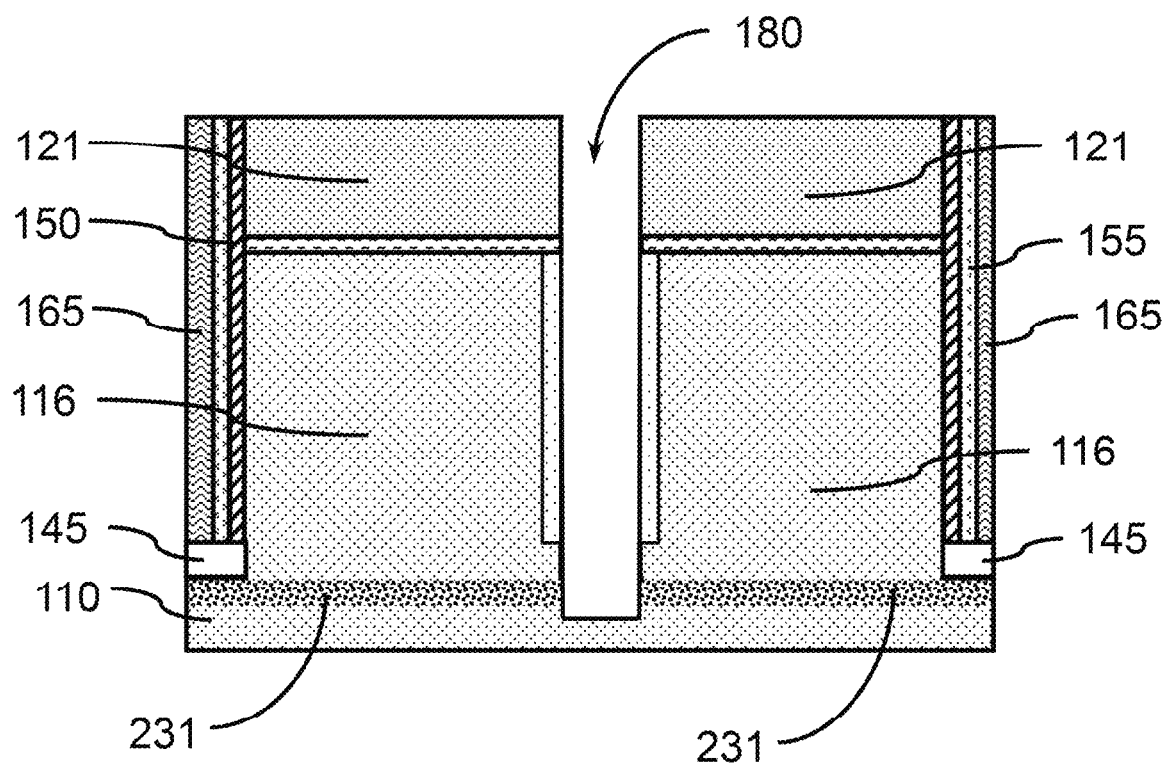
FIG. 19 is a cross-sectional side view of the long axis of the hardmask fin templates and vertical fin segments with a portion of the doped region removed from between neighboring fin segments, in accordance with an exemplary embodiment.

FIG. 19 is a cross-sectional side view of the long axis of the hardmask fin templates and vertical fin segments with a portion of the doped region removed from between neighboring fin segments, in accordance with an exemplary embodiment.

In one or more embodiments, a portion of the doped region 230 may be removed to increase the depth of the fin trench(es) 180 to the substrate 110. The entire doped region 230 may be removed to at least the substrate surface to form two or more separate doped region segments 231, which may be electrically isolated from each other. Each separate doped region segment 231 may thereby form a separate bottom source/drain for a vertical finFET. The fin trench(es) 180 may penetrate a depth into the substrate to form shallow trench isolation regions between neighboring vertical finFET devices.

Figure 20:
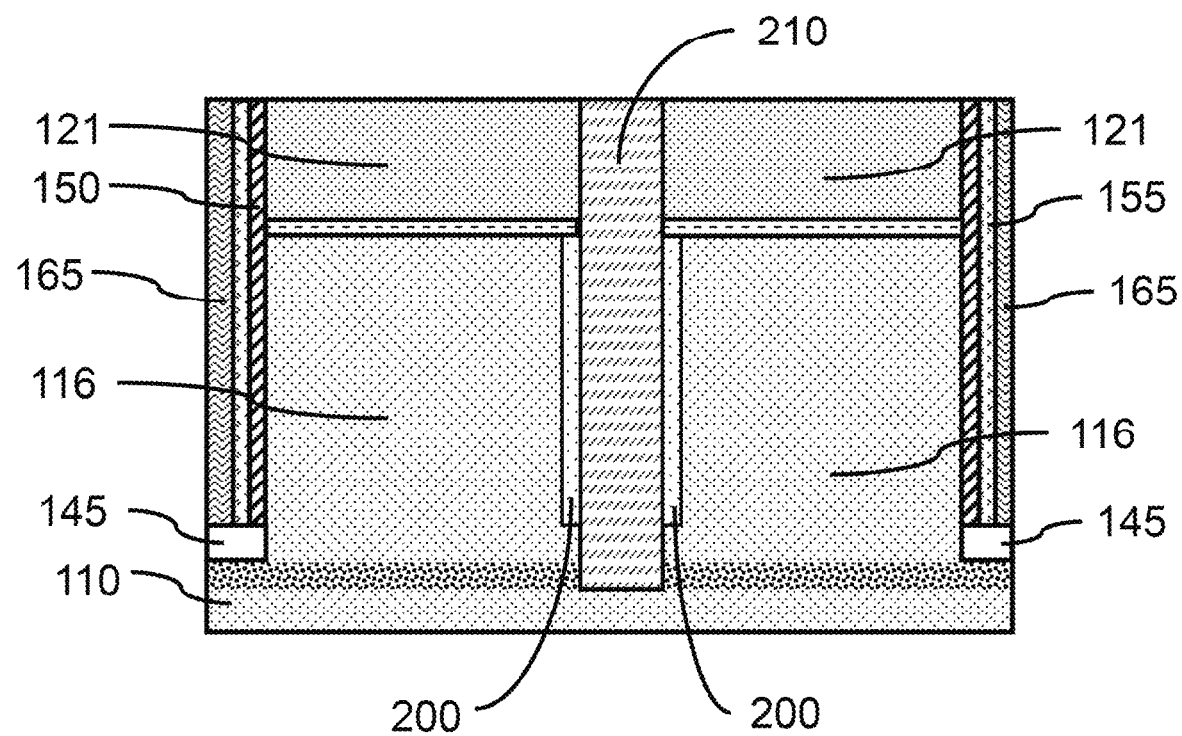
FIG. 20 is a cross-sectional side view of the long axis of the hardmask fin templates and vertical fin segments with a dielectric fill between neighboring fin segments, in accordance with an exemplary embodiment.

FIG. 20 is a cross-sectional side view of the long axis of the hardmask fin templates and vertical fin segments with a dielectric fill between neighboring fin segments, in accordance with an exemplary embodiment.

In one or more embodiments, a dielectric fill 210 may be formed in the one or more fin trench(es) 180 to electrically isolate neighboring vertical fin segments 116. The dielectric fill 210 may be a silicon oxide (SiO), a low-k oxide (e.g., fluorine doped SiO, carbon doped SiO, porous SiO, etc.), or combinations thereof. The dielectric fill 210 may be an insulating material that forms a shallow trench isolation region.

Figure 21:
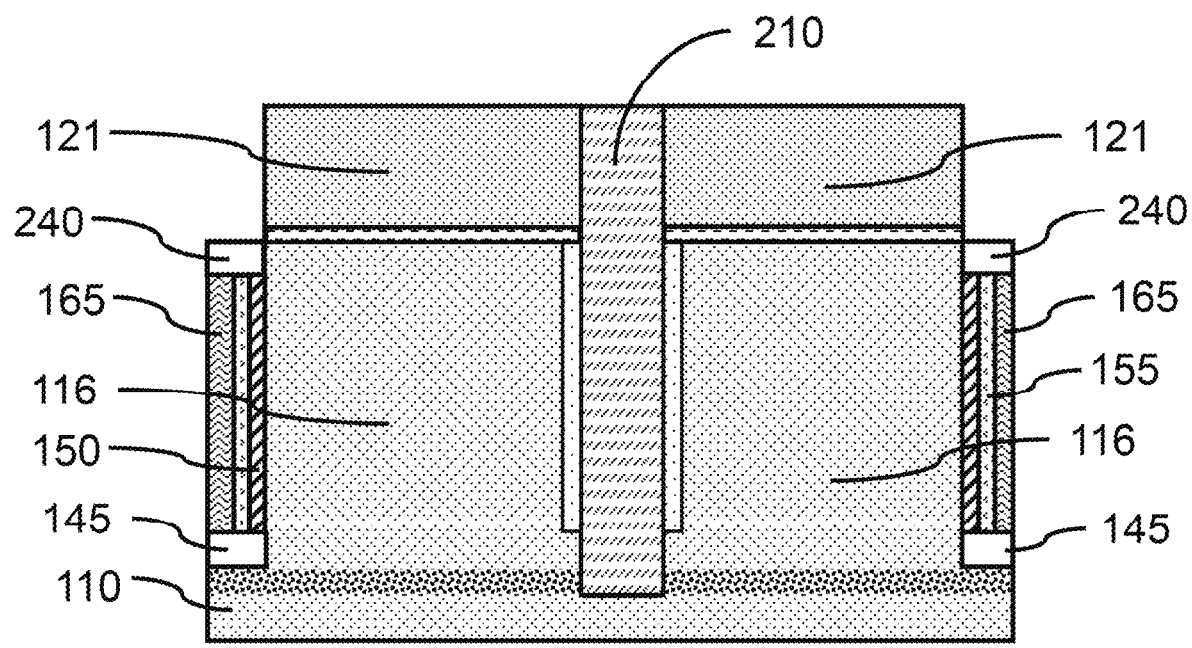
FIG. 21 is a cross-sectional side view of the long axis of the hardmask fin templates and vertical fin segments with top spacers formed on reduced height gate fill blocks, in accordance with an exemplary embodiment.

FIG. 21 is a cross-sectional side view of the long axis of the hardmask fin templates and vertical fin segments with top spacers formed on reduced height gate fill blocks in accordance with an exemplary embodiment.

In one or more embodiments, a portion of the gate fill block(s) 165, gate dielectric layer 150, and work function layer 155 may be removed to reduce the height of the gate fill block(s) 165. The gate fill block material, gate dielectric layer, and work function layer may be removed until the top surface of the gate fill block(s) 165 and layers is below the top surface of the vertical fin segments 116 by an intended thickness of the top spacers 240. Top spacer(s) 240 may be formed on the exposed surfaces of the gate fill block(s) 165, gate dielectric layer 150, and work function layer 155, for example, by CVD, PVD, ALD, GCIB, or a combination thereof. The hardmask fin templates 121 and dielectric fill 210 may be masked during removal of the portion of the gate fill block(s) 165 and layers 150, 155, and/or formation of the top spacers 240. The top spacers 240 may provide electrical isolation of the gate fill block(s) 165, gate dielectric layer 150, and work function layer 155, from a top source/drain.

In various embodiments, the top spacers 240 may be, for example, silicon oxide (SiO), silicon nitride (SiN), silicon boron carbonitride (SiBCN), silicon oxycarbide (SiOC), etc.

Figure 22:
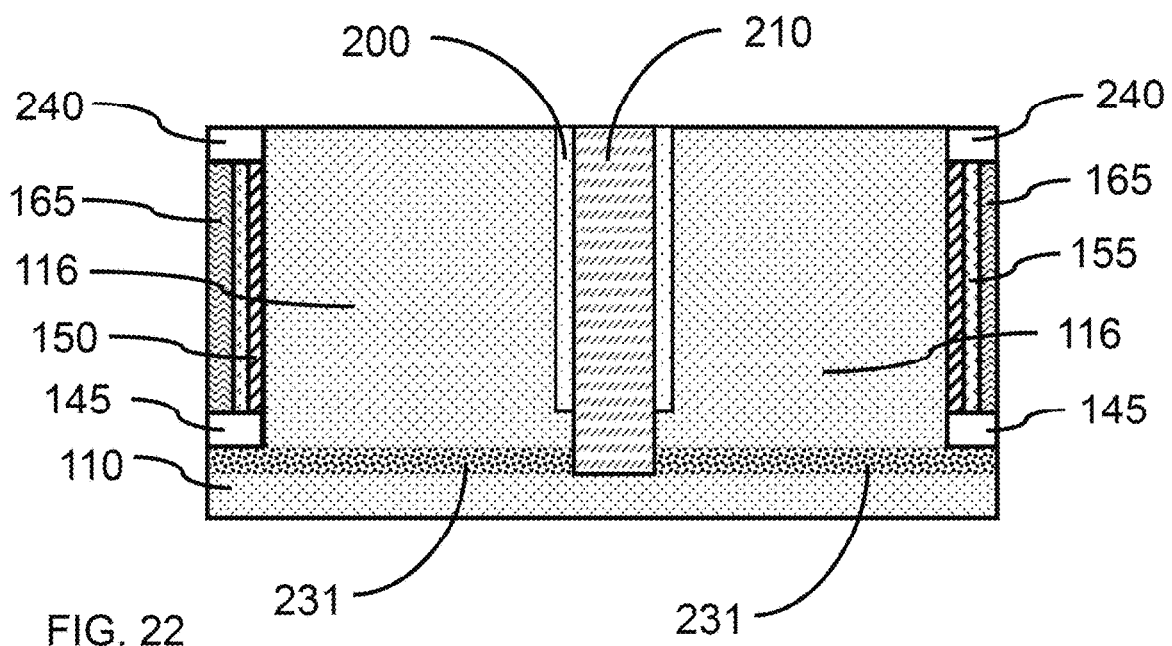
FIG. 22 is a cross-sectional side view of the long axis of the vertical fin segments with a dielectric fill after removal of the hardmask fin templates, in accordance with an exemplary embodiment.

FIG. 22 is a cross-sectional side view of the long axis of the vertical fin segments with a dielectric fill after removal of the hardmask fin templates in accordance with an exemplary embodiment.

In one or more embodiments, the hardmask fin templates 121 may be removed from the one or more vertical fin segments 116. In various embodiments, the template liners 126 may also be removed from the one or more vertical fin segments 116 if a liner layer 125 was previously formed on the vertical fin segments 116. The hardmask fin templates 121 (and template liners 126) may be removed by a chemical-mechanical polishing, where the height of the dielectric fill 210, doped layer 200, vertical fin segments 116, and top spacers 240 may be reduced by the CMP to form a uniform, flat surface. The heights of the vertical fin segments 116, doped layer 200, and dielectric fill 210 may be reduced to the height of the top(s) of the top surface of the top spacers 240 to provide a flat surface at a uniform height.

Figure 23:
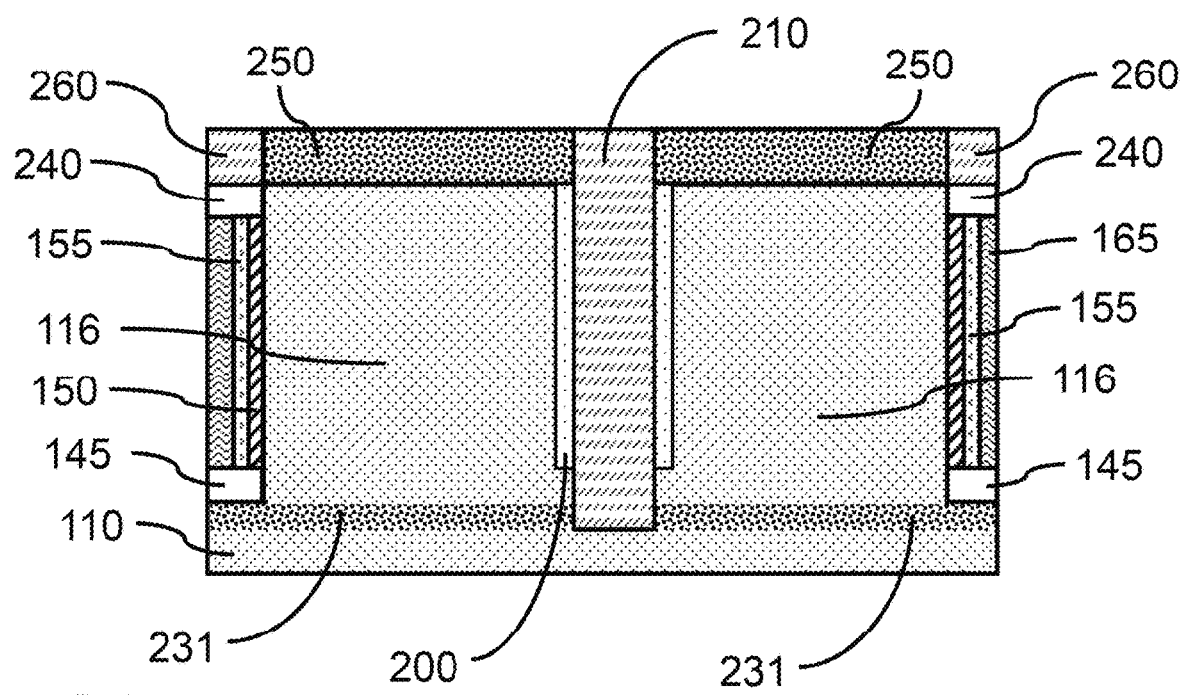
FIG. 23 is a cross-sectional side view of the long axis of the vertical fin segments with a top source/drain and dielectric cap on the top spacers, in accordance with an exemplary embodiment.

FIG. 23 is a cross-sectional side view of the long axis of the vertical fin segments with a top source/drain and dielectric cap on the top spacers in accordance with an exemplary embodiment.

In one or more embodiment, a top source/drain 250 may be formed on one or more vertical fin segments 116. The top source/drain 250 may be formed by an epitaxial growth process, where the top source/drain 250 has the same crystal orientation and structure as the vertical fin segment 116 on which the top source/drain is formed. The top source/drain 250 may be doped in-situ or ex-situ, where the doping may be an n-type dopant or a p-type dopant to form an n-type vertical FET (NFET) or a p-type vertical FET (PFET) in conjunction with the doped region segment 231 forming the bottom source/drain, and the channel formed by the vertical fin segment 116. The doping type of the doped layer 200 may also be determined by whether an NFET or PFET is being fabricated.

In various embodiments, the top source/drain 250 may be the same material as the vertical fin segment 116. The source and drain may be interchanged, where the doped regions 231 forms a drain and the epitaxially formed doped material at the top of the vertical fin segment 116 may be the source.

In one or more embodiments, a dielectric cap layer may be formed on the top spacer(s) 240 and the top source/drain 250, where the dielectric cap layer may be blanket deposited on the exposed top surfaces of the top spacers 240 and top source/drain. The height of the dielectric cap layer may then be reduced, for example, by CMP to form dielectric cap(s) 260 on the top spacer(s) 240, while exposing the top source/drain for electrical connections.

In various embodiments, the dielectric cap(s) 260 may be, for example, silicon oxide (SiO), silicon nitride (SiN), silicon boron carbonitride (SiBCN), silicon oxycarbide (SiOC), etc. The dielectric cap(s) 260 may be the same or different material as the top spacer(s) 240. In various embodiments, the dielectric cap(s) 260 and top spacer(s) 240 can be formed together to reduce the number of formation steps, where the dielectric cap(s) 260 and top spacer(s) 240 are the same material. In various embodiments, the dielectric cap(s) 260 and top spacer(s) 240 are different material(s) from the hardmask fin templates 121, so the hardmask fin templates 121 may be selectively etched for forming the top source/drain(s).

Figure 24:
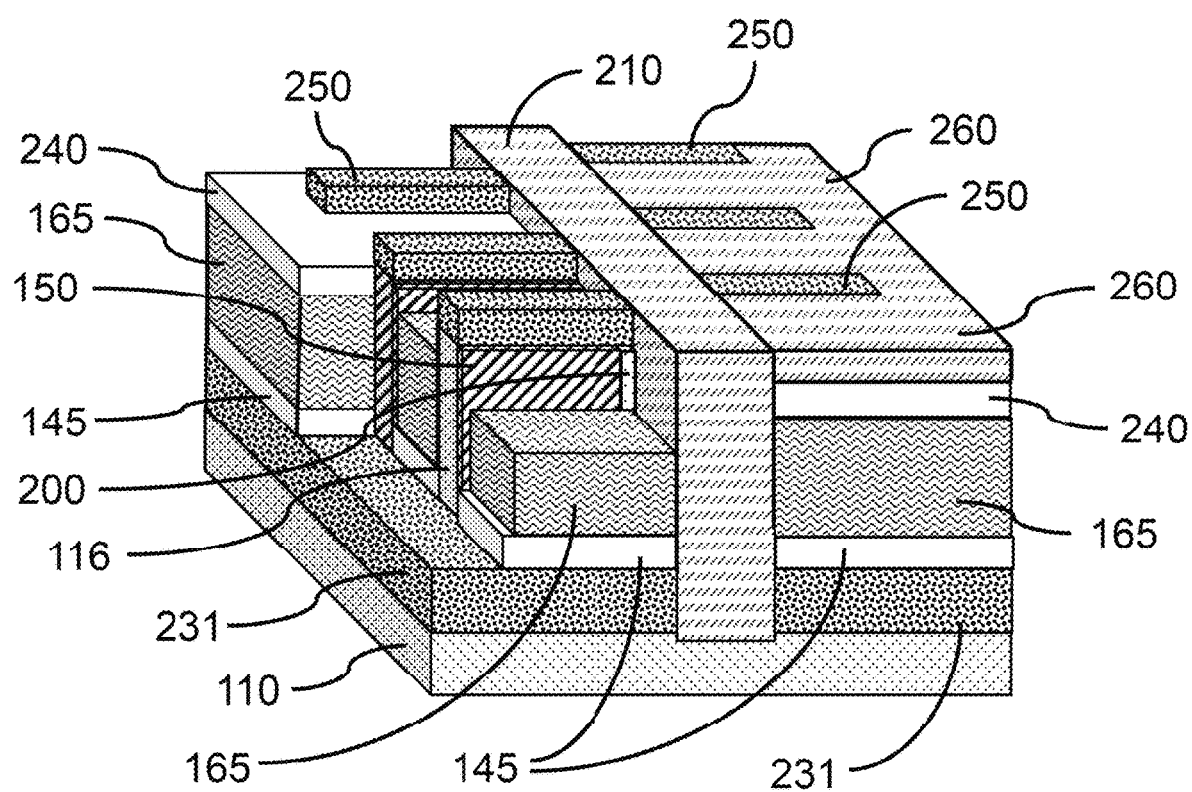
FIG. 24 is a perspective view of different partial cut-aways showing otherwise hidden features of vertical finFETs on a substrate, in accordance with an exemplary embodiment.

FIG. 24 is a perspective view of different partial cutaways showing otherwise hidden features of vertical finFETs on a substrate in accordance with an exemplary embodiment.

In an exemplary embodiments, a plurality of vertical finFETs may be formed on a substrate 110, wherein each vertical finFET includes a vertical fin segment 116 as a channel on a doped region segment 231 in the substrate. The doped region segment 231 is below one or more vertical fin segment(s) 116 and can act as a bottom source/drain. A single doped region segment 231 may be below a plurality of vertical fin segments 116, and electrically couple the vertical fin segments 116 into a multiple fin finFET. A dielectric fill 210 separates a vertical fin 111 into the two vertical fin segment 116. The dielectric fill 210 extends through the doped region to the bulk substrate to electrically separate the doped region segments 231. One endwall of each vertical fin segment 116 facing each other across the dielectric fill 210 has doped layer 200 adjacent to the dielectric fill 210.

Gate dielectric layers 150 are on opposite sidewalls of each vertical fin segment 116, and gate fill blocks 165 wrap around the gate dielectric layers 150 and end wall opposite the doped layer 200 to form a gate structure on three sides of the vertical fin segments 116. The gate fill blocks 165 are physically separated and electrically isolated from the doped region segment(s) 231 in the substrate 110 by the bottom spacers 145. A top spacer 240 is on the gate fill blocks 165, and physically separates and electrically isolates the gate fill blocks 165 from the top source/drain 250 on each vertical fin segment 116. The top spacer 240 wraps around three sides the vertical fin segment 116. Dielectric cap(s) 260 are on the top spacer(s) 240, and wrap around three sides the top source/drain 250.

In various embodiments, the top source/drain 250, bottom source/drain, and vertical fin segments 116 form at least a portion of a vertical finFET. In various embodiments, the top source/drain 250 and bottom source/drain may be n-doped or p-doped. The top source/drain 250 and bottom source/drain also may be interchanged.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed below could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin field effect transistor (vertical finFET) with a self-aligned gate structure, comprising:
   forming a plurality of vertical fins on a substrate;
   forming gate dielectric layers on at least opposite sidewalls of each vertical fin;
   forming a gate fill layer between the vertical fins; and
   removing portions of the gate fill layer and vertical fins to form one or more fin trench(es), and to form two or more vertical fin segments from each of the plurality of vertical fins, wherein there is a separation distance, $D_1$, between each of the two vertical fin segments.

2. The method of claim 1, wherein the separation distance, $D_1$, between the two vertical fin segments is in the range of about 10 nm to about 200 nm.

3. The method of claim 1, further comprising forming a fin liner in at least a portion of the one or more fin trench(es); and annealing the fin liner to form a doped layer on at least a portion of the vertical fin segments adjacent to the fin liner.

4. The method of claim 3, wherein the fin liner is phospho-silicate glass (PSG), boro-silicate glass (BSG), or boro-phospho-silicate glass (BPSG), and annealing the fin liner is conducted at a temperature in the range of about 700° C. to about 1100° C.

5. The method of claim 4, wherein the fin liner is conformally deposited by low pressure CVD (LPCVD).

6. The method of claim 3, further comprising removing the fin liner and a portion of a doped region beneath the vertical fins to extend each of the one or more fin trench(es) to the substrate and form two doped region segments from each of the doped regions.

7. The method of claim 1, further comprising forming a dielectric fill in the one or more fin trench(es) between adjacent vertical fin segments.

8. The method of claim 1, further comprising forming a top source/drain on each of the vertical fin segments.

9. A method of forming a vertical fin field effect transistor (vertical finFET) with a self-aligned gate structure and doped layer, comprising:
   forming a plurality of vertical fins on a substrate;
   forming dielectric layers on at least opposite sidewalls of each vertical fin;
   forming a bottom spacer layer on exposed portions of the substrate surface;
   forming a gate fill layer on the bottom spacer layer between the vertical fins;
   removing portions of the gate fill layer and vertical fins to form one or more fin trench(es), and to form two vertical fin segments from each of the plurality of vertical fins with a separation distance in the range of about 10 nm to about 200 nm between the two vertical fin segments;
   forming a fin liner on at least a portion of the sidewalls of the one or more fin trench(es); and
   annealing the fin liner to form a doped layer on at least a portion of the vertical fin segments exposed in the fin trench(es).

10. The method of claim 9, further comprising forming a dielectric fill in the one or more fin trench(es) between adjacent vertical fin segments.

11. The method of claim 9, wherein the plurality of vertical fins are formed by a sidewall image transfer (SIT) process.

12. The method of claim 9, wherein the separation distance, $D_1$, between the two vertical fin segments is in the range of about 30 nm to about 100 nm.

13. The method of claim 12, wherein a mask alignment or realignment step is not required to form the fin trench, gate fill blocks, and vertical fin segments.

14. A vertical fin field effect transistor (vertical finFET) with a self-aligned gate structure, comprising:
   two or more vertical fin segments formed in a column on a substrate, wherein there is a separation distance, $D_1$, between each of the two or more vertical fin segments in the column;

one or more doped region segments formed in the substrate beneath each of the two or more vertical fin segments;

a doped layer on the end wall of each of the two or more vertical fin segments separated by distance, $D_1$; and a dielectric fill between the doped layers on the adjacent vertical fin segments.

15. The vertical finFET of claim 14, wherein the separation distance, $D_1$, between the two vertical fin segments is in the range of about 10 nm to about 200 nm.

16. The vertical finFET of claim 14, wherein the doped layer includes a dopant concentration in the range of about $1 \times 10^{17}$ $1/cm^3$ to about $5 \times 10^{19}$ $1/cm^3$.

17. The vertical finFET of claim 14, wherein the doped layer extends into the end wall of the vertical fin segment a depth in the range of about 2 nm to about 20 nm.

18. The vertical finFET of claim 14, wherein the doped layer includes a boron dopant or a phosphorus dopant.

19. The vertical finFET of claim 14, further comprising one or more bottom spacers formed on the substrate, a gate fill block formed on each of the one or more bottom spacer, and a top spacer formed on the gate fill blocks.

20. The vertical finFET of claim 19, wherein the bottom spacer is silicon oxide, the gate dielectric layer is a high-k dielectric material, and the top spacer is silicon oxide.

* * * * *